(12) United States Patent
Kwak et al.

(10) Patent No.: US 7,858,491 B2
(45) Date of Patent: Dec. 28, 2010

(54) METHOD OF FABRICATING SEMICONDUCTOR DEVICE

(75) Inventors: Noh Yeal Kwak, Icheon-si (KR); Min Sik Jang, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 479 days.

(21) Appl. No.: 11/962,386

(22) Filed: Dec. 21, 2007

(65) Prior Publication Data

US 2008/0268624 A1 Oct. 30, 2008

(30) Foreign Application Priority Data

Apr. 27, 2007 (KR) .................. 10-2007-0041414

(51) Int. Cl.
   *H01L 21/76* (2006.01)
(52) U.S. Cl. ............. 438/433; 438/514; 438/527; 257/E21.551
(58) Field of Classification Search .......... 438/424, 438/435, 436, 527, 775, 433, 514; 257/E21.546, 257/E21.551
   See application file for complete search history.

(56) References Cited

U.S. PATENT DOCUMENTS

| | | | | |
|---|---|---|---|---|
| 5,470,766 A * | 11/1995 | Lien | ............. | 438/419 |
| 5,795,801 A * | 8/1998 | Lee | ............. | 438/199 |
| 5,895,251 A * | 4/1999 | Kim | ............. | 438/401 |
| 6,103,582 A * | 8/2000 | Lee et al. | ............. | 438/299 |
| 6,255,153 B1 * | 7/2001 | Ryoo | ............. | 438/217 |
| 6,281,094 B1 * | 8/2001 | Abiko et al. | ............. | 438/433 |
| 6,716,701 B1 * | 4/2004 | Kwak et al. | ............. | 438/257 |
| 7,008,836 B2 | 3/2006 | Algotsson et al. | ............. | 438/224 |
| 7,161,198 B2 * | 1/2007 | Omi et al. | ............. | 257/288 |
| 7,270,886 B2 * | 9/2007 | Lee et al. | ............. | 428/447 |
| 7,465,643 B2 * | 12/2008 | Kim | ............. | 438/424 |
| 2002/0197779 A1 * | 12/2002 | Evans | ............. | 438/186 |
| 2004/0097059 A1 * | 5/2004 | Kwak | ............. | 438/525 |

(Continued)

FOREIGN PATENT DOCUMENTS

KR   10-2000-001331   1/2000

(Continued)

*Primary Examiner*—Matthew C Landau
*Assistant Examiner*—Joseph C Nicely
(74) *Attorney, Agent, or Firm*—Marshall, Gerstein & Borun LLP

(57) ABSTRACT

This invention relates to a method of fabricating a semiconductor device. A P well for a cell junction may be formed by performing an ion implantation process employing a zero tilt condition. Stress caused by collision between a dopant and a Si lattice within a semiconductor substrate may be minimized and, therefore stress remaining within the semiconductor substrate may be minimized. Accordingly, Number Of Program (NOP) fail by disturbance caused by stress remaining within a channel junction may be reduced. Further, a broad doping profile may be formed at the interface of trenches by using $BF_2$ as the dopant when the P well is formed. A fluorine getter layer may be formed on an oxide film of the trench sidewalls and may be used as a boron diffusion barrier. Although a Spin On Dielectric (SOD) insulating layer may be used as an isolation layer, loss of boron (B) may be prevented. Accordingly, an additional ion implantation process for compensating for lost boron (B) may be omitted and a NOP disturbance characteristic may be improved.

19 Claims, 3 Drawing Sheets

U.S. PATENT DOCUMENTS

| | | | |
|---|---|---|---|
| 2004/0209431 A1* | 10/2004 | Oyu et al. | 438/301 |
| 2005/0233524 A1* | 10/2005 | Lee | 438/264 |
| 2005/0233531 A1* | 10/2005 | Kwak | 438/289 |
| 2005/0285150 A1* | 12/2005 | Birner et al. | 257/213 |
| 2006/0051930 A1* | 3/2006 | Lee et al. | 438/424 |
| 2006/0071269 A1* | 4/2006 | Hebert | 257/335 |
| 2006/0102940 A1* | 5/2006 | Cha et al. | 257/294 |
| 2006/0110942 A1* | 5/2006 | Lee | 438/786 |
| 2007/0034900 A1 | 2/2007 | Tsai | 257/197 |
| 2007/0077710 A1* | 4/2007 | Lee | 438/257 |
| 2007/0141801 A1* | 6/2007 | Kwon et al. | 438/400 |
| 2007/0148840 A1* | 6/2007 | Sheen et al. | 438/197 |
| 2007/0166889 A1* | 7/2007 | Lee | 438/142 |
| 2008/0149983 A1* | 6/2008 | Rassel et al. | 257/312 |

FOREIGN PATENT DOCUMENTS

| | | |
|---|---|---|
| KR | 2001-61412 | 7/2001 |
| KR | 2006-38243 | 5/2006 |

* cited by examiner

METHOD OF FABRICATING SEMICONDUCTOR DEVICE

CROSS-REFERENCES TO RELATED APPLICATIONS

This invention claims priority to Korean patent application number 10-2007-41414, filed on Apr. 27, 2007, the disclosure of which is incorporated by reference in its entirety.

TECHNICAL FIELD

This invention relates to a method of fabricating a semiconductor device and, more particularly, to a method of fabricating a semiconductor device with improved disturbance characteristic.

BACKGROUND OF THE INVENTION

Generally, in a semiconductor device, a well junction may be formed by performing an ion implantation process in order to control the threshold voltage of a transistor. In recent years, as devices are highly integrated, the well junction may be formed by implanting an impurity of a high concentration so as to secure the characteristics of the transistor when the ion implantation process is performed. Further, in forming a Shallow Trench Isolation (STI) layer a STI structure in which trenches may be formed in a semiconductor substrate and then gap filled with an insulating material may be used rather than an existing LOCal Oxidation of Silicon (LOCOS) structure. Thus, etch damage to sidewall of a silicon (Si) substrate due to excessive Si etch is inevitable.

Stress within a channel junction may be increased by implant damage. The increased stress grows into defects due to a subsequent annealing process, thus generating disturbances caused by Transit Enhanced Diffusion (TED). In the case of a flash memory device on which program and erase may be performed using channel boosting, Number Of Program (NOP) fail occurs due to the existence of disturbances within the channel junction. This becomes more severe at certain portions, which becomes a cause of remaining stress within an active region.

Further, a method of gap filling trenches using a Spin on Dielectric (SOD) material as a trench gap-fill material has recently been introduced because of the trench gap-fill limits of a High Density Plasma (HDP) oxide film. In particular, there is a method of fully gap filling trenches using polysilazane (PSZ) that has a low viscosity and a flowing property like water. However, if the trenches are gap filled with the SOD material, dopant segregation may be increased due to the stress of the material and a subsequent annealing process. Accordingly, the leakage current may be increased due to the occurrence of hump. Furthermore, compensation for the lost dopant through additional ion implantation may cause cell disturbances to further increase.

SUMMARY OF THE INVENTION

This invention is directed to a method of fabricating a semiconductor device wherein a P well is formed by performing an ion implantation process at a zero tilt condition, so that a stress caused by collision of a dopant and a Si lattice may be minimized. NOP fail due to disturbance caused by stress remaining within a channel junction of a semiconductor substrate may be reduced.

A method of fabricating a semiconductor device according to one embodiment, includes: forming a Triple N (TN) well in a semiconductor substrate, forming a P well within the TN well region by performing an ion implantation process employing a zero tilt condition, forming an isolation mask over the semiconductor substrate, etching the isolation mask and the semiconductor substrate of an isolation region, thus forming trenches within the P well region, and forming isolation layers that gap fills the trenches.

In one embodiment, a screen oxide layer may be further formed over the semiconductor substrate to a thickness of approximately 300 to 500 angstrom. The TN well may be formed using an ion implantation process employing ion implantation energy of approximately 800 to 2000 keV with a dose of approximately $1 \times 10^{11}$ to $1 \times 10^{14}$ ions/cm$^2$ by applying a N type dopant at a tilt condition of approximately 2 to 10 degrees. An annealing process may be further performed, for example, using furnace annealing at a temperature ranging from 900 to 1000 degrees Celsius after the TN well is formed.

In one embodiment, the P well may be formed by performing the ion implantation process using boron difluoride (BF$_2$) as a dopant. The ion implantation process may be performed using ion implantation energy of approximately 200 to 500 keV with a dose of approximately $1 \times 10^{11}$ to $1 \times 10^{14}$ ions/cm$^2$. The ion implantation process may be performed in a single type. An ion implantation region for threshold voltage control may be further formed within the P well region by performing the ion implantation process using ion implantation energy of approximately 5 to 50 keV with a dose of approximately $1 \times 10^{11}$ to $1 \times 10^{14}$ ions/cm$^2$ by using BF$_2$ as a dopant.

In one embodiment, an ion implantation region for compensating for boron (B) may be further formed on sidewalls of the trenches. The ion implantation region for boron (B) compensation may be formed by performing the ion implantation process using ion implantation energy of approximately 5 to 50 keV with a dose of $1 \times 10^{11}$ to $1 \times 10^{14}$ ions/cm$^2$ by using boron (B) as a dopant. Alternatively, the ion implantation region for boron (B) compensation may be formed by performing the ion implantation process in nitrogen (N$_2$) gas atmosphere.

In one embodiment, an oxide film may be further formed on sidewalls of the trenches. A fluorine getter layer in which fluorine ions (F—) implanted when the P well is formed are condensed may be formed on the oxide film of the trenches sidewalls. The formation of the isolation layer may include: forming an insulating layer by depositing an insulating material on the patterned isolation mask, including the trenches so that the trenches are gap filled, and etching the insulating layer until a surface of the nitride film of the isolation mask is exposed.

In one embodiment, the isolation layer may be formed from a Spin on Dielectric (SOD) insulating layer. The process of forming the SOD insulating layer may include a SOD coating process, a baking process, and a curing process. The SOD coating process may be performed using a polysilazane (PSZ)-based material. The baking process may be performed at a temperature ranging from 50 to 250 degrees Celsius. The curing process may be performed at a temperature ranging from 200 to 400 degrees Celsius.

DETAILED DESCRIPTION

Figure 1A:
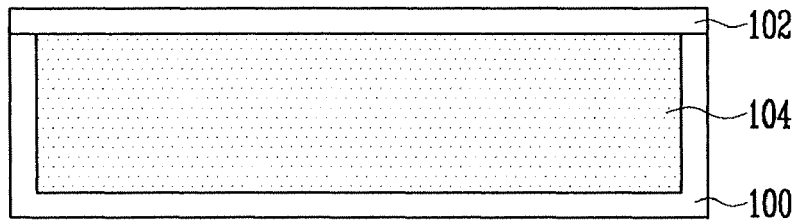
FIGS. 1A to 1I are sectional views illustrating a method of fabricating a semiconductor device according to an embodiment of the invention.

Now, specific embodiments according to the present invention will now be described in further details with reference to the accompanying drawings.

While the invention is susceptible to various manners, certain embodiments as shown by way of example in the drawings and these embodiments will be described in detail herein. It will be understood, however, that this disclosure is not intended to limit the invention to the particular forms described, but to the contrary, the invention is intended to cover all modifications, alternatives, and equivalents falling within the spirit and scope of the invention defined by the appended claims.

Referring to FIG. 1A, a screen oxide layer 102 is formed over a semiconductor substrate 100. The screen oxide layer 102 may be formed, for example, using an oxidation process, preferably, a wet oxidization process at a temperature ranging from 750 to 800 degrees Celsius. Other types of oxidation techniques may be used. The screen oxide layer 102 may be formed to a thickness of approximately 300 to 500 angstrom in order to prevent an ion channeling when forming a P well (See FIG. 1B).

A Triple N (TN) well 104 may be formed, for example, using an ion implantation process employing an ion implantation energy of approximately 800 to 2000 keV with a dose of approximately $1 \times 10^{11}$ to $1 \times 10^{14}$ ions/cm$^2$, for example, by applying a N type dopant having a tilt-angle of approximately 2 to 10 degrees such that a concentration at a Projected Range ($R_p$) may be maximized for clarifying the boundary between the TN well 104 and the P type semiconductor substrate 100.

To compensate for damaging the semiconductor substrate 100 due to the high-energy ion implantor when forming the TN well 104, an annealing process may be performed, preferably, a furnace annealing process at a temperature ranging from 900 to 1000 degrees Celsius. Other types of annealing techniques may be used.

Figure 1B:
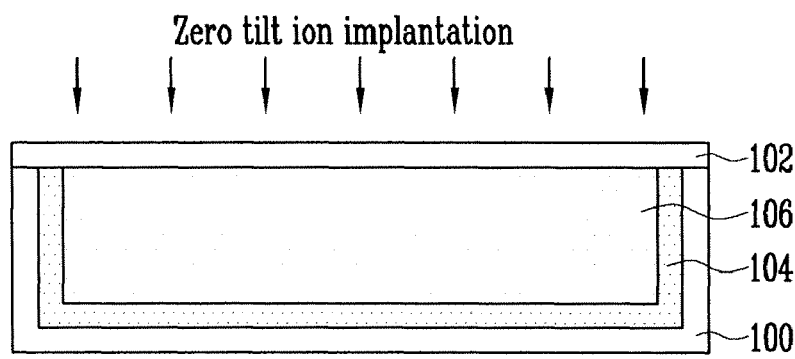

Referring to FIG. 1B, a P well 106 is formed within the TN well 104 by performing, for example, an ion implantation process at a zero tilt-angle. The ion implantation process may be performed using ion implantation energy of approximately 200 to 500 keV with a dose of approximately $1 \div 10^{11}$ to $1 \times 10^{14}$ ion/cm$^2$, for example, using boron difluoride (BF$_2$) as a dopant. The zero tilt-angle ion implantation refers to an angle where an impurity (dopant) is implanted being substantially vertical to the semiconductor substrate 100. Further, the zero tilt-angle ion implantation may be performed in a single type in order to maximize the uniformity of doping within the large-sized semiconductor substrate 100. Thus, collision between the dopant and the silicon (Si) lattice within the semiconductor substrate 100 may be minimized, and stress within the P well 106 may be minimized. Accordingly, NOP fail by disturbance caused by stress remaining due to collision may be prevented and a cell disturbance characteristic may be improved.

Further, the ion implantation process for forming the P well 106 may be performed using BF$_2$, having a mass greater than boron (B), as a dopant in a single type. Thus, a broad doping profile may be formed at interface sidewalls of trenches (as shown in FIG. 1E), so that abnormal channeling, which may occur due to the zero tilt-angle may be minimized. Meanwhile, when the broad doping profile is formed, an end of range (EOR) defect-caused profile within the semiconductor substrate 100 may become a broad profile.

Figure 1C:
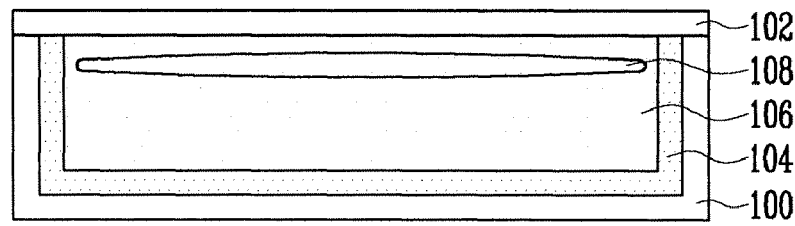

Referring to FIG. 1C, in order to control the threshold voltage ($V^{th}$) of a transistor, an ion implantation process employing a P type dopant may be further carried out. The ion implantation process may be performed using an ion implantation energy of approximately 5 to 50 keV with a dose of approximately $1 \times 10^{11}$ to $1 \times 10^{14}$ ions/cm$^2$, for example, by using BF$_2$ as a dopant. Thus, an ion implantation region 108 for threshold voltage control may be formed on an upper side of the P well 106 and within the P well 106.

Figure 1D:
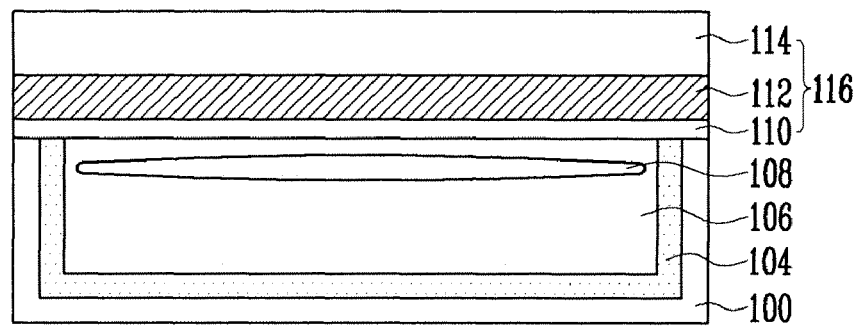
Figure 1E:
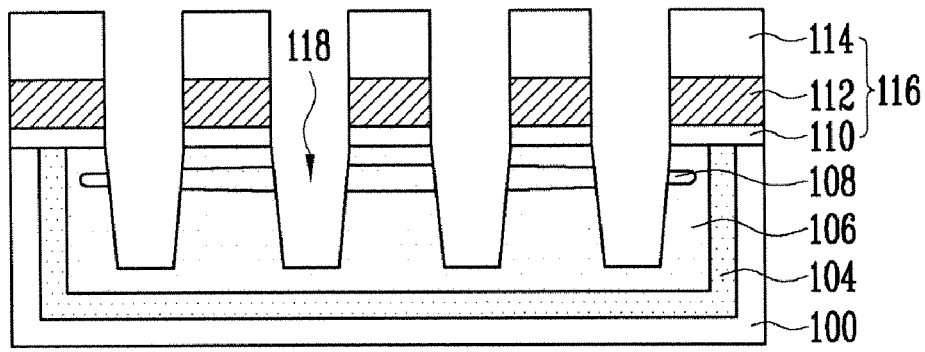

Referring to FIG. 1D, the screen oxide layer 102 is removed, for example, by performing an etching process. The screen oxide layer 102 may be removed, for example, using a wet etching process, for example, employing buffered oide etchant (BOE) or diluted solution of HF (DHF). Other types of etchant may be used. An isolation mask 116 for forming an isolation layer of a STI structure may be formed over the semiconductor substrate 100, including upper surfaces of the TN well 104 and the P well 106. The isolation mask 116 may include a buffer oxide film 110, a nitride film 112 and a hard mask 114. The buffer oxide film 110 may be formed, for example, from silicon oxide (SiO$_2$), for example, using an oxidization process. The nitride film 112 may be formed from a nitride-based material, for example, silicon nitride (SixNy) or silicon oxynitride (SiON). The hard mask 114 may be formed, for example, from oxide-based or carbon polymer-based material. The nitride film 112 and the hard mask 114 may be formed, for example, using a chemical vapor deposition (CVD) method. Other types of technique may be used.

Referring to FIG. 1E, the isolation mask 116 formed over an isolation region may be partially removed, for example, using an etching process, for example, employing a photoresist patterned isolation mask (not shown), such that at least a surface of the ion implantation region 108, the P well 106, the TN well 104, and the semiconductor substrate 100 of the isolation region are exposed. The isolation region may be etched to a thickness, thereby The isolation region of the exposed semiconductor substrate 100 may be etched to a specific thickness using an etch process employing the patterned isolation mask 116 as a mask, thus forming a plurality of trenches 118 in the isolation region.

The photoresist mask (not shown) may be formed by coating a photoresist on the hard mask 114 to form a photoresist film and then performing exposure and development employing a previously designed mask. The photoresist pattern may be removed through etching in the process of forming the trenches 118, or may be removed through an additional etching process when the photo mask is to remain on the isolation region. Other techniques may be substituted without varying from the scope of the invention.

Figure 1F:
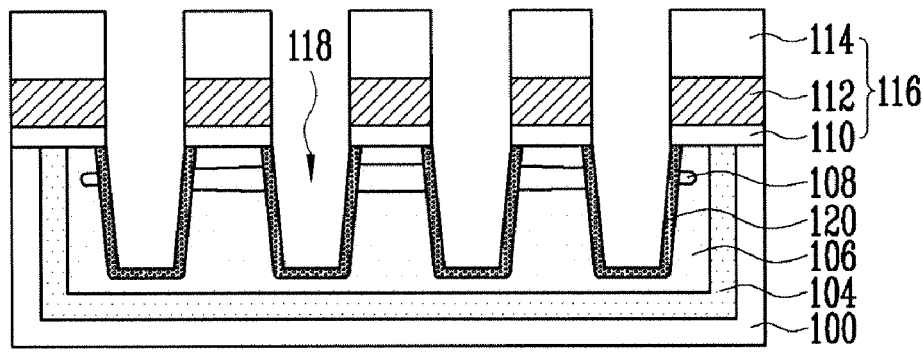

Referring to FIG. 1F, an ion implantation process may be performed to compensate for loss of boron (B) ions and thus prevent hump. As shown, an ion implantation region 120 for B ions compensation may be formed on sidewalls of the trenches 118. The ion implantation process may be performed using an ion implantation energy of approximately 5 to 50 keV with a dose of $1 \times 10^{11}$ to $1 \times 10^{14}$ ions/cm$^2$, for example, by using B as a dopant. The ion implantation process may be performed, for example, in nitrogen (N$_2$) gas atmosphere in order to form Si—N bonding in the semiconductor substrate 100.

Figure 1G:
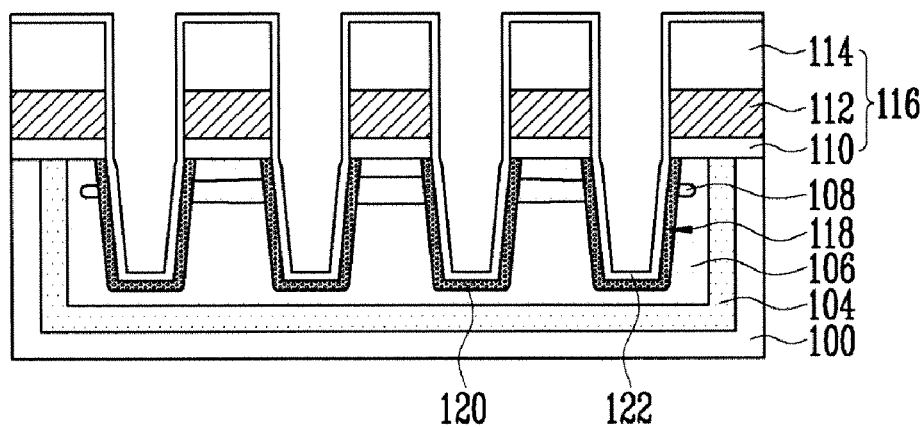

Referring to FIG. 1G, an oxide film 122 may formed on the sidewalls of the trenches 118, including the ion implantation 108, the P well 106, and the TN well 104 to compensate for etch damage occurred when the trenches 118 are formed, and to help prevent fail bits due to the stress of the gap-fill material of the trenches 118, an oxide film 122 is formed on the sidewalls of the trenches 118. The oxide film 122 may be formed, for example, from silicon oxide ($SiO_2$) using a wet oxidization process at a temperature ranging from 750 to 800 degrees Celsius to prohibit the behavior of the dopant for threshold voltage control to the greatest extent. Alternatively, the oxide film 122 may be formed on the exposed surfaces of the buffer oxide film 110, the nitride film 112, and the hard mask 114 when the oxidization process is performed. The oxide film 122 formed on the side walls of the exposed surfaces of the buffer oxide film 110, the nitride film 112, and the hard mask 114 may be thinner compared with the oxide film 122 formed on the sidewall of the trenches 118.

A fluorine getter layer (not shown) in which fluorine ions (F—) implanted when forming the P well 106 are condensed, may be formed at an interface (an interface of $Si/SiO_2$) of the trenches 118 and the oxide film 122 due to oxidation enhanced diffusion (OEF). Getter broun (B) may be gathered by the fluorine getter layer formed in the oxide film 122 of trenches 118, thus preventing the leakage current of a cell region. Further, P type getters that are not caused by remnant rebonding within the cell region may be generated, thereby removing stress of the semiconductor substrate 100.

Figure 1H:
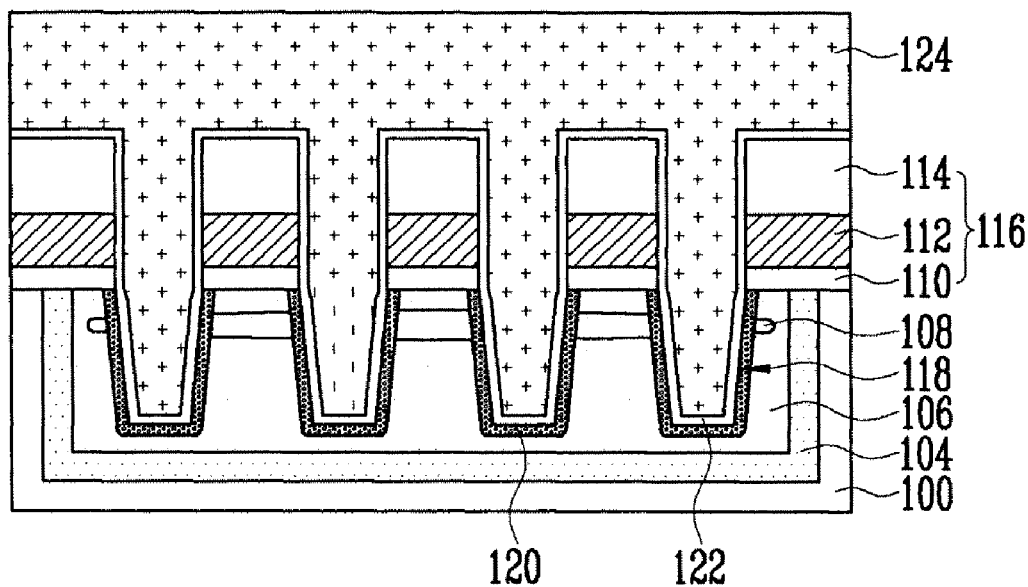

Referring to FIG. 1H, an insulating layer 124 may be deposited on the patterned isolation mask 116, including the trenches 118, so that the trenches 118 are gap filled. The insulating layer 124 may be formed, for example, from a SOD insulating layer having a good flow property and a trench gap-fill characteristic, using a SOD method. Other types of film deposition may be used. The SOD insulating layer 124 may be formed, for example, from a PSZ-based material, thus gap fill the trenches 118 without void.

The process of forming the SOD insulating layer 124 may include an optional baking process, a curing process, and a coating process. The baking process for hardening a coated film may be performed at a temperature ranging from 50 to 250 degrees Celsius. The curing process for out-gasing impurities gas included in the PSZ layer and densifying the film quality may be performed at a temperature ranging from 200 to 400 degrees Celsius so that bending may be prevented in the active region of the semiconductor substrate 100 due to internal stress of the isolation region.

Figure 1I:
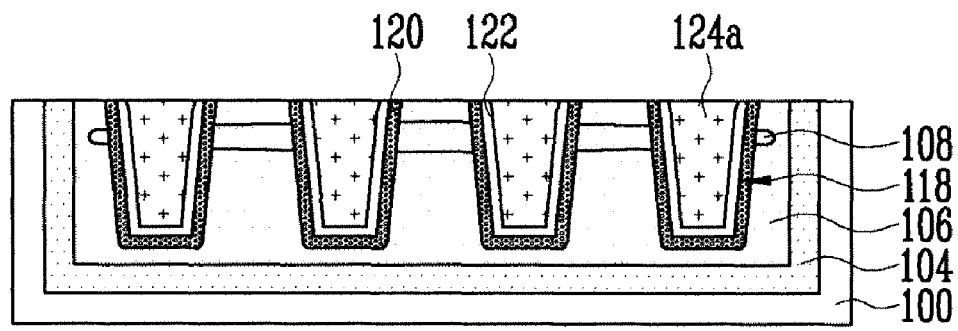

Referring to FIG. 1I, the insulating layer 124 over the isolation mask 116 may be etched until a surface of the nitride film 112 of the isolation mask 116 is exposed, leaving the insulating layer 124 within the trench 118 un-etched, defining isolation layers 124a. The etching process may be performed, for example, using a CMP process.

In order to control the Effective Field oxide Height (EFH), at least a portion of the isolation layer 124a may be etched, for example, using a dry etch process or a wet etch process. To prevent lowering of a cycling characteristic. The isolation layer 124a may be etched to a thickness substantially the same or higher than the semiconductor substrate 100. The nitride film 112 may be removed completely, for example, using a phosphoric acid ($H_3PO_4$) after the etching process. The buffer oxide film 110 may also be removed when the process of removing the nitride film 112 is performed. A cleaning process, for example, using BOE or DHF may be performed to completely remove the buffer oxide film 110 that remains during the process of removing the nitride film 112 and the buffer oxide film 110.

Though not shown in the drawings, a tunnel insulating film and a conductive layer for a floating gate may be formed over the semiconductor substrate 100 and then patterned. A dielectric layer and the conductive layer for a control gate may be laminated over the semiconductor substrate 100 and then patterned, thus forming a gate consisting of the tunnel insulating film, the floating gate, the dielectric layer and a control gate. Subsequent processes are then performed.

As described above, in the method of fabricating the semiconductor device according to a preferred embodiment of the invention, the P well for the cell junction may be formed by performing the ion implantation process employing the zero tilt-angle. Thus, stress caused by collision between a dopant and the Si lattice within the semiconductor substrate may be minimized and any stress remaining within the semiconductor substrate may be minimized. Accordingly, NOP fail by disturbance caused by stress remaining within the channel junction may be reduced. A broad doping profile may be formed at the interface of the trenches by using $BF_2$ as the dopant when the P well is formed. The fluorine getter layer may be formed on the oxide film of the trench sidewalls and may be used as a boron diffusion barrier. A SOD insulating layer may be used as an isolation layer so as to prevent from loss of boron (B). Accordingly, an additional ion implantation process for compensating for lost boron (B) may be omitted and a NOP disturbance characteristic may be improved. Further, the leakage current of the cell region may be prevented when the boron (B) is gettered by the fluorine getter layer formed in the oxide film of the trench sidewalls. Any P type getters that are not caused by remaining rebonding within the cell region may be generated. The isolation layer formed from the SOD insulating layer, thus improving a trench gap-fill capability and the reliability of devices. Accordingly, an additional ion implantation process for compensating for lost boron (B) may be omitted, thus simplifying the whole process.

What is claimed is:

1. A method of fabricating a semiconductor device, the method comprising:

forming a Triple N (TN) well in a semiconductor substrate;

forming a P well within the TN well;

forming trenches by etching portions of the P well;

performing an ion implantation process to implant boron (B) ions into the trenches in nitrogen ($N_2$) gas atmosphere; and forming isolation layers that gap fills the trenches.

2. The method of claim 1, further comprising forming a screen oxide layer over the semiconductor substrate to a thickness of approximately 300 to 500 angstrom.

3. The method of claim 1, wherein the TN well is formed using an ion implantation process.

4. The method of claim 3, wherein the ion implantation process is performed using ion implantation energy of approximately 800 to 2000 keV with a dose of approximately $1 \times 1011$ to $1 \times 1014$ ions/cm2 by applying a N type dopant at a tilt angle of approximately 2 to 10 degrees.

5. The method of claim 1, further comprising performing an annealing process at a temperature ranging from 900 to 1000 degrees Celsius after the TN well is formed.

6. The method of claim 1, wherein the P well is formed by an ion implantation process.

7. The method of claim 6, wherein the ion implantation process is performed using ion implantation energy of 200 to 500 keV with a dose of $1 \times 1011$ to $1 \times 1014$ ions/cm2 using boron difluoride (BF2) as a dopant.

8. The method of claim 6, wherein the ion implantation process is performed in a single implantation step.

9. The method of claim 1, further comprising forming an ion implantation region for threshold voltage control within the P well after the P well is formed.

10. The method of claim 9, wherein the ion implantation region is formed using ion implanted boron (B).

11. The method of claim 10, wherein the ion implantation process is performed using ion implantation energy of 5 to 50 keV with a dose of $1\times10^{11}$ to $1\times10^{14}$ ions/cm2 by using BF2 as a dopant.

12. The method of claim 1, wherein the implantation process comprises using an ion implantation energy of 5 to 50 keV with a dose of $1\times10^{11}$ to $1\times10^{14}$ ions/cm2 by using boron (B) as a dopant.

13. The method of claim 1, further comprising forming an oxide film on sidewalls of the trenches.

14. The method of claim 1, wherein the formation of the isolation layers comprises:
   forming an insulating layer by depositing an insulating material, so that the trenches are gap filled.

15. The method of claim 1, wherein the isolation layer is formed from a Spin on Dielectric (SOD) insulating layer.

16. The method of claim 15, wherein the process of forming the SOD insulating layer comprises a SOD coating process, a baking process, and a curing process.

17. The method of claim 16, wherein the SOD coating process is performed using a polysilazane (PSZ)-based material.

18. The method of claim 16, wherein the baking process is performed at a temperature ranging from 50 to 250 degrees Celsius.

19. The method of claim 16, wherein the curing process is performed at a temperature ranging from 200 to 400 degrees Celsius.

* * * * *